United States Patent
Ahmed et al.

(10) Patent No.: US 8,233,852 B2
(45) Date of Patent: Jul. 31, 2012

(54) CALIBRATION TECHNIQUES FOR NON-LINEAR DEVICES

(75) Inventors: Walid K. M. Ahmed, Tinton Falls, NJ (US); Eoin Carey, Cork (IR); Qing Li, Princeton Junction, NJ (US); Ajit K. Reddy, Matawan, NJ (US)

(73) Assignee: Pine Valley Investments, Inc., Las Vegas, NV (US)

( * ) Notice: Subject to any disclaimer, the term of this patent is extended or adjusted under 35 U.S.C. 154(b) by 770 days.

(21) Appl. No.: 12/098,290

(22) Filed: Apr. 4, 2008

(65) Prior Publication Data

US 2009/0251195 A1  Oct. 8, 2009

(51) Int. Cl.
*H03C 1/62* (2006.01)

(52) U.S. Cl. .......... 455/115.1; 455/63.1; 455/67.13; 455/67.14; 455/67.16; 455/114.3; 455/127.1; 455/127.2; 455/126; 375/296; 375/297

(58) Field of Classification Search .......... 455/114.3, 455/126, 127.1, 127.2, 63.1, 67.11, 67.13, 455/67.14, 114.1, 114.2, 115.1, 115.2, 115.3, 455/67.16; 375/297, 296
See application file for complete search history.

(56) References Cited

U.S. PATENT DOCUMENTS

| | | | |
|---|---|---|---|
| 5,745,527 A | 4/1998 | Kelton | |
| 6,043,707 A | 3/2000 | Budnik | |
| 6,141,390 A | 10/2000 | Cova | |
| 6,304,140 B1 | 10/2001 | Thron et al. | |
| 6,445,249 B1 | 9/2002 | Khan et al. | |
| 6,600,369 B2 | 7/2003 | Mitzloff | |
| 6,650,691 B2 | 11/2003 | Cramer, III | |
| 6,735,419 B2 | 5/2004 | Mitzloff | |
| 6,834,183 B2 | 12/2004 | Black | |
| 6,850,574 B2 | 2/2005 | Schwent | |
| 6,898,252 B1 | 5/2005 | Yellin et al. | |
| 6,937,874 B2 | 8/2005 | Cramer, III | |
| 7,012,970 B2 | 3/2006 | Greenwood | |
| 7,020,215 B2 | 3/2006 | Porco | |
| 7,085,330 B1 | 8/2006 | Shirali | |
| 7,289,777 B2 * | 10/2007 | Mohsen et al. ............ 455/127.1 |
| 7,333,781 B1 * | 2/2008 | Stockstad et al. ............ 455/126 |
| 7,340,235 B1 * | 3/2008 | Madsen et al. ............ 455/240.1 |

(Continued)

OTHER PUBLICATIONS

Information about related Patents and Patent Applications, see section 6 of the accompanying Information Disclosure Statement Letter, which concerns related Patents and Patent Applications.

*Primary Examiner* — Junpeng Chen
(74) *Attorney, Agent, or Firm* — Fox Rothschild, LLP; Robert J. Sacco

(57) ABSTRACT

An apparatus may include a non-linear module, a control module, and a calibration module. The non-linear module produces an output signal from an input signal. The control module selects, upon an occurrence of a calibration condition, a calibration operation from two or more calibration operations. Each of the two or more calibration operations may generate one or more correction values for the non-linear module. Further, each of the calibration operations produces the input signal from a pre-input signal. This selected calibration operation is performed by the calibration module. The two or more calibration operations include a first calibration operation and a second calibration operation. The first calibration operation produces the input signal from the pre-input signal according to a predictive technique. The second calibration operation produces the input signal from the pre-input signal according to a non-predictive technique.

15 Claims, 4 Drawing Sheets

U.S. PATENT DOCUMENTS

| | | |
|---|---|---|
| 7,449,960 B2 | 11/2008 | Bunch et al. |
| 7,742,748 B2 | 6/2010 | Matero et al. |
| 7,962,108 B1 * | 6/2011 | Khlat et al. ............... 455/114.3 |
| 2002/0196864 A1 | 12/2002 | Booth et al. |
| 2003/0095608 A1 | 5/2003 | Duperray |
| 2003/0102912 A1 | 6/2003 | Tripathi et al. |
| 2003/0215025 A1 | 11/2003 | Hietala |
| 2003/0215026 A1 | 11/2003 | Hietala |
| 2004/0047432 A1 | 3/2004 | Iwasaki |
| 2004/0208259 A1 | 10/2004 | Hunton |
| 2004/0219891 A1 | 11/2004 | Hadjichristos |
| 2004/0242170 A1 * | 12/2004 | Gilbert ..................... 455/127.1 |
| 2005/0085198 A1 | 4/2005 | Anvari |
| 2005/0122166 A1 | 6/2005 | Premakanthan |
| 2005/0130609 A1 | 6/2005 | Nagode |
| 2005/0245208 A1 | 11/2005 | Udagawa et al. |
| 2006/0067424 A1 | 3/2006 | Wolf |
| 2006/0071711 A1 | 4/2006 | Persson et al. |
| 2006/0128324 A1 | 6/2006 | Tan |
| 2006/0178120 A1 | 8/2006 | Puma |
| 2007/0189417 A1 | 8/2007 | Waheed et al. |
| 2007/0190952 A1 | 8/2007 | Waheed et al. |
| 2007/0211821 A1 | 9/2007 | Haque et al. |
| 2007/0223621 A1 | 9/2007 | Ahmed |
| 2007/0230612 A1 | 10/2007 | Ahmed |
| 2008/0051042 A1 * | 2/2008 | Komaili et al. ............ 455/114.3 |
| 2008/0074209 A1 | 3/2008 | Ceylan et al. |
| 2008/0225981 A1 * | 9/2008 | Reddy et al. ................. 375/297 |
| 2008/0225984 A1 * | 9/2008 | Ahmed et al. ................ 375/302 |
| 2009/0052575 A1 * | 2/2009 | Waheed et al. ............... 375/297 |
| 2009/0054000 A1 | 2/2009 | Waheed et al. |
| 2009/0054018 A1 * | 2/2009 | Waheed et al. ............... 455/126 |
| 2009/0122911 A1 | 5/2009 | Carey |
| 2009/0202018 A1 | 8/2009 | Reddy et al. |
| 2009/0280758 A1 * | 11/2009 | Pratt et al. .................. 455/127.2 |
| 2010/0009642 A1 * | 1/2010 | Pratt et al. .................. 455/127.1 |
| 2010/0027711 A1 | 2/2010 | Manku et al. |

* cited by examiner

CALIBRATION TECHNIQUES FOR NON-LINEAR DEVICES

BACKGROUND

Many devices include non-linear elements, such as power amplifiers. These elements produce output signals from input signals in accordance with non-linear relationships.

Often, specific performance requirements do not accommodate such non-linear relationships. For instance, wireless communications standards, (e.g., GSM/EDGE, WCDMA, and so forth) call for strict spectral requirements to be met. In order to meet such requirements, devices must preserve waveform quality at various power levels.

Thus, techniques are often needed to mitigate non-linearities so that output signals are produced in accordance with more linear relationships. However, a tradeoff often exists between reducing non-linearities and providing efficiency. More particularly, some non-linear devices operate more efficiently when the output response is non-linear. For example, a power amplifier may become increasingly efficient as its operation approaches saturation.

Correction techniques can be employed to compensate for non-linearities. Such techniques typically involve a preliminary stage that precedes a non-linear element. The preliminary stage creates a "pre-distorted" input signal that is sent to the non-linear element. As a result, the preliminary stage and non-linear element may, in cascade, operate in a substantially linear manner.

Accordingly, techniques are needed to determine characteristics for pre-distortion operations.

SUMMARY

In embodiments, an apparatus may include a non-linear module, a control module, and a calibration module. The non-linear module produces an output signal from an input signal. The control module selects, upon an occurrence of a calibration condition, a calibration operation from two or more calibration operations. Each of the two or more calibration operations may generate one or more correction values for the non-linear module. Further, each of the calibration operations produces the input signal from a pre-input signal. This selected calibration operation is performed by the calibration module.

The two or more calibration operations include a first calibration operation and a second calibration operation. The first calibration operation produces the input signal from the pre-input signal according to a predictive technique. The second calibration operation produces the input signal from the pre-input signal according to a non-predictive technique.

In further embodiments, a device may include a transmit module, a receive module, and a antenna. The transmit module may include the apparatus features described above.

In yet further embodiments, a method selects a calibration operation from two or more calibration operations. This selection is made upon an occurrence of a calibration condition. The selected calibration operation is performed for a non-linear module that produces an output signal from an input signal. The two or more calibration operations may include a first calibration operation and a second calibration operation, as described above.

Further features are described in the following description and accompanying drawings.

DETAILED DESCRIPTION

Figure 1:
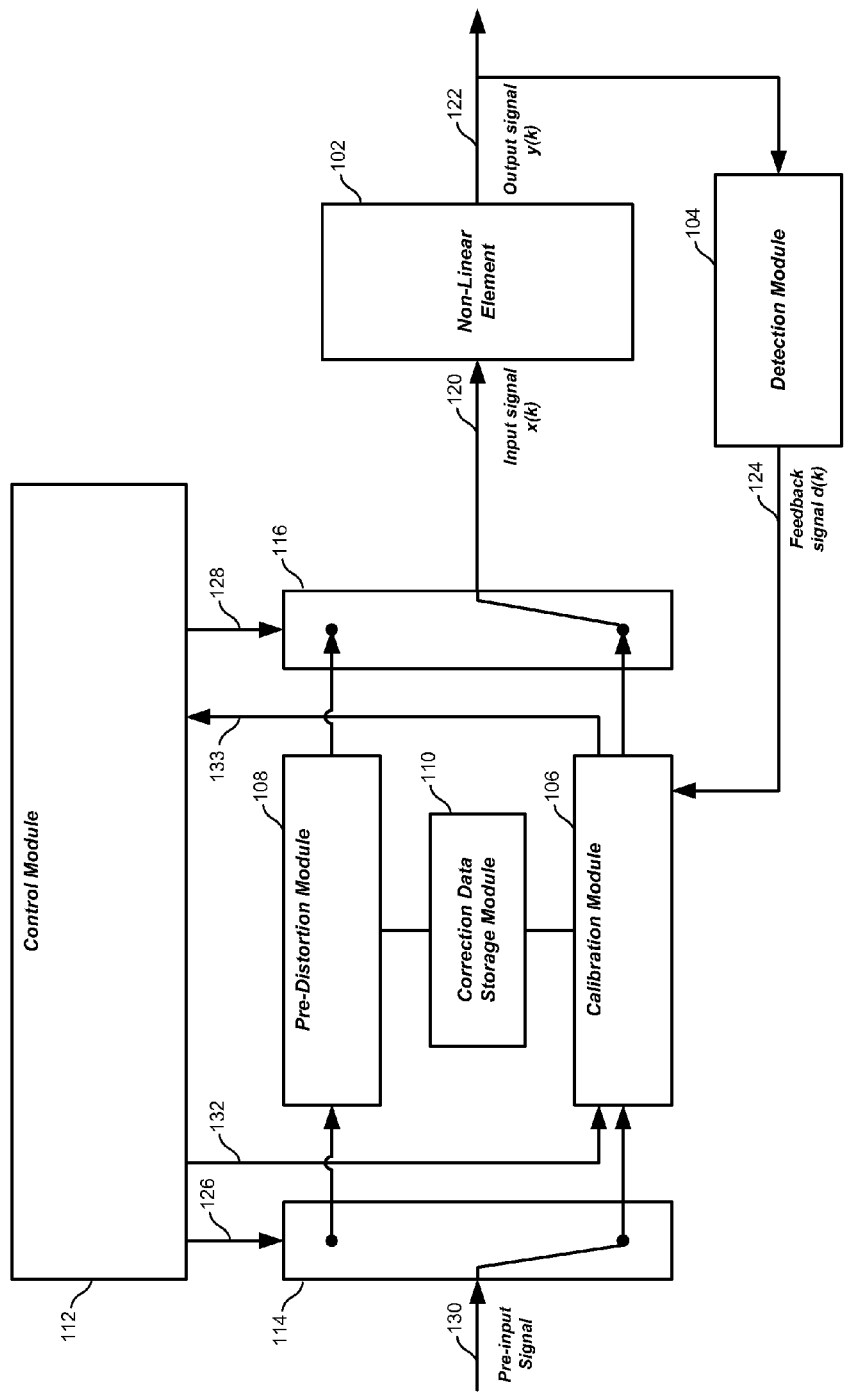
FIG. 1 is a diagram of an exemplary apparatus.

Embodiments involve calibration techniques for non-linear devices. Examples of non-linear devices include (but are not limited to) power amplifiers suitable for use in wireless communications transmitters. Such calibration techniques may be implemented on the same board or chip with a non-linear device. Embodiments, however, are not limited to such implementations.

Calibration involves determining correction values. Such correction values may be used to pre-distort a pre-input signal before the signal is sent to a non-linear device as an input signal. Such calibration operations may be closed-loop. More particularly, embodiments may include a feedback path that samples (e.g., in real-time) output signals from the non-linear device. The sampled output signals may then be compared with reference signals. From such comparisons, non-linear characteristics of devices may be determined and/or predicted.

Embodiments may sample output signals and perform operations involving calibration at any time. For example, in contexts involving the transmission of communications signals, calibration may occur during power ramp-up intervals, during power ramp-down intervals, during the modulation and transmission of data, during time intervals when no data is being transmitted, and/or during other times. As a result, embodiments are not limited to traditional factory calibration techniques, such as calibrating based on dedicated test/training signal patterns.

Moreover, embodiments may select among multiple operations involving calibration. For example, an operation may be selected that both determines correction values and performs predictive correction of pre-input signals. This predictive correction may occur in real time. Alternatively, an operation may be selected that by passes predictive correction.

Operations involving calibration may be selected for particular types of signals. For example, operations that involve both calibration and predictive correction may be selected for power ramp-up signals and power ramp-down signals. However, operations that bypass predictive correction may be selected for other signals, such as data-bearing signals. The embodiments, however, are not limited to these examples.

Details regarding the aforementioned features, as well as further features, are provided below. For instance, FIG. 1 is a block diagram illustrating an apparatus 100 that may operate according to the techniques described herein.

Apparatus 100 may include various elements. For example, FIG. 1 shows apparatus 100 including a non-linear module 102, a detection module 104, a calibration module 106, a pre-distortion module 108, a correction data storage module 110, and a control module 112. In addition, FIG. 1 shows apparatus 100 including switch modules 114 and 116. These elements may be implemented in hardware, software, firmware, or in any combination thereof. For example, these elements may be implemented on a substrate (e.g., a printed circuit board ("PCB")). This substrate may include various components, such as one or more chips, and/or a variety of electrical and electronic platforms. These components may be used in wireless systems, speaker systems, computer systems, electronic devices, and so forth. Embodiments, however, are not limited to these examples.

FIG. 1 shows that non-linear module 102 receives an input signal 120 and generates a corresponding output signal 122. These signals may be digital or analog signals. Furthermore, these signals may be either baseband or radio frequency (RF) signals. FIG. 1 shows that signals 120 and 122 are also represented as x(k) and y(k), respectively. In these representations, k denotes a data point.

Non-linear module 102 may have any number of inputs and outputs. Thus, signals 120 and 122 (also shown as x(k) and y(k)) may be one-dimensional or multi-dimensional. For example, these signals may be two-dimensional signals, each having an amplitude component signal (R) and a phase component signal (θ). Alternatively, these signals may be two-dimensional signals, each having an in-phase (I) component signal and a quadrature (Q) component signal. Embodiments, however, are not limited to these examples.

In generating output signal 122, module 102 may exhibit non-linear characteristics. Accordingly, non-linear module 102 may include one or more components, such as a power amplifier. An exemplary implementation of non-linear module 102 is described below with reference to FIG. 2.

As shown in FIG. 1, non-linear module 102 is coupled to detection module 104. Detection module 104 receives and samples data from output signal 122. This may involve, for example, performing operations such as down conversion (e.g., when output signal 122 is an RF signal), filtering, analog to digital conversion (e.g., when output signal 122 is an analog signal), and/or sampling. Other operations may be additionally or alternatively performed.

As a result, detection module 104 produces a feedback signal 124, which is sent to calibration module 106. In embodiments, feedback signal 124 is a digital signal (e.g., sequence(s) of digital values). However, feedback signal 124 may alternatively be an analog signal. FIG. 1 shows that feedback signal 124 is also designated as d(k), where k denotes a data point. Like signals 120 and 122, feedback signal 124 may be one-dimensional or multi-dimensional. For example, feedback signal 124 may include amplitude and phase (or in-phase and quadrature) component signals. However, embodiments are not limited to these examples.

FIG. 1 shows a pre-input signal 130 that may convey data for transmission to remote devices. As shown in FIG. 1, pre-input signal 130 may be selectively sent (via switch module 114) to calibration module 106 or to pre-distortion module 108. Like signals 120, 122, and 124, pre-input signal 130 may be one-dimensional or multi-dimensional. For example, pre-input signal 130 may include amplitude (R) and phase (θ) component signals. Embodiments, however, are not limited to these examples.

Pre-input signal 130 may be in various formats. For instance, pre-input signal 130 may be in a first format that involves a substantially steady stream of symbols having few or no interruptions. For example, pre-input signal 130 may be formatted for transmission across wideband code division multiple access (WCDMA) wireless networks. Alternatively, pre-input signal 130 may be in a second format that involves intermittent bursts of symbols occurring at predetermined time intervals. These intervals may be, for example, one or more time slots within a time division multiple access (TDMA) transmission frame. Thus, pre-input signal 130 may be formatted for transmission across GSM/EDGE wireless networks. These formats and networks are provided as examples. Accordingly, other signal formats and/or networks may be employed.

In embodiments, pre-input signal 130 may include portions (occurring at certain times) that do not convey information. Power transitions may occur during such portions of pre-input signal 130. For example, such portions of pre-input signal 130 may facilitate ramp-up operations and/or ramp-down operations.

Ramp-up operations increase the power of output signal 122 to a target level within a predetermined time window. Conversely, ramp-down operations decrease the power of output signal 122 to a target level within a predetermined time interval. Such changes in the power of output signal 122 may occur through changes in the power of pre-input signal 130. Ramp-up operations may be associated with burst transmissions in TDMA networks (e.g., in GSM/EDGE networks). For instance, "ramping-up" may precede a burst transmission's information-bearing signals, while "ramping-down" may follow such information-bearing signals.

FIG. 1 shows that calibration module 106 may receive pre-input signal 130 (via switch module 114). Also, calibration module 106 receives feedback signal 124. In addition, calibration module 106 may receive other inputs. For instance, FIG. 1 further shows that calibration module 106 may receive a calibration directive 132 from control module 112. In response to this directive, calibration module 106 may perform calibration operations.

For example, calibration module 106 may perform closed-loop calibration operations based on feedback signal 124 and corresponding reference signals (e.g., pre-input signal 130). Through these operations, calibration module 106 may determine non-linear characteristics of module 102. In turn, calibration module 106 may generate values (referred to herein as correction values) to compensate for these non-linear characteristics. Once generated, these values may be stored in correction data storage module 110 along with corresponding values of pre-input signal 130.

In addition to generating correction values, calibration module 106 produces input signal 120 from pre-input signal 130. This may involve leaving pre-input signal 130 unchanged (i.e., simply passing pre-input signal 130 to non-linear module 102 as input signal 120). Alternatively, this may involve changing values of pre-input signal 130 to produce input signal 120.

For instance, calibration module 106 may employ predictive correction techniques that change values of pre-input signal 130 (to produce input signal 120) based on predicted or extrapolated non-linear characteristics of non-linear module 102. Such techniques may be advantageously employed to ensure that output signal 122 complies with spectral emissions requirements. Exemplary predictive correction techniques are described below.

In embodiments, predictive correction may be selectively performed. For instance, calibration module 106 may perform predictive correction when certain condition(s) occur. For example, predictive correction may be performed for certain signal types. Such signal types may include ramp-up and/or ramp-down signals.

Correction data storage module 110 stores entries of correction values for corresponding values of pre-input signal 130. Thus, correction data storage module 110 may be implemented as a lookup table (LUT). Accordingly, correction data storage module 110 may include a storage media (e.g., memory) to store signal values and correction values.

In embodiments involving signals having multiple component signals (e.g., amplitude and phase component signals), each entry may include multiple correction values. That is, each correction value within an entry may correspond to a particular component signal. For example, an entry may include an amplitude correction value and a phase correction value. However, other combinations of correction value(s) may be employed.

Pre-distortion module 108 may perform pre-distortion operations. More particularly, correction module 108 may pre-distort pre-input signal 130. This may involve adjusting values of pre-input signal 130 based on corresponding correction values to produce input signal 120. Through such operations, pre-distortion module 108 and non-linear module 102 may, in cascade, behave linearly.

As described above, pre-input signal 130 may include amplitude and phase component signals. In embodiments, pre-distortion module 108 may adjust pre-input signal 130 by scaling values of component signal(s) with their corresponding pre-distortion values. Other adjustment techniques, however, may be employed.

Pre-distortion module 108 may obtain such correction values from correction data storage module 110. This may involve, for example, accessing corresponding addresses (e.g., addresses that correspond to values of pre-input signal 130) in correction data storage module 110.

Apparatus 100 may operate in various modes, such as a calibration mode and a correction mode. These modes involve the production of input signal 120 from pre-input signal 130. For instance, in the calibration mode, calibration module 106 produces input signal 120 from pre-input signal 130. Alternatively, in the correction mode, pre-distortion module 108 produces input signal 120 from pre-input signal 130.

Such modes may be selected by control module 112. Based on this selection, control module 112 may operate switch modules 114 and 116 through control signals 126 and 128, respectively. For instance, in the calibration mode, switch modules 114 and 116 may be set so that calibration module 106 generates input signal 120. However, in the correction mode, switch modules 114 and 116 may be set so that pre-distortion module 108 generates input signal 120. For purposes illustration, FIG. 1 shows switch modules 114 and 116 being set for calibration mode operations. However, these switch modules may be alternatively set for correction mode operations.

Control module 112 may select an operational mode based on various factors. For example, control module 112 may select the calibration mode upon the occurrence of one or more calibration conditions. Exemplary calibration conditions include the occurrence of a ramp-up operation and/or a ramp-down operation. As described above, a ramp-up operation may occur at the beginning of (or prior to) a burst transmission. In contrast, a ramp-down operations may occur at the end of (or following) a burst transmission.

Another exemplary calibration condition is the occurrence of a power level change. Such power level changes may be based on a power control algorithm employed by a wireless network. Moreover, such power level changes may occur during the transmission of data. For example, in the context of WCDMA networks, power level changes may occur periodically during data transmission. Thus, such situations may involve power level changes when pre-input signal 130 is conveying data.

As described above, embodiments may employ predictive correction techniques. Such techniques may be employed to manage spectral characteristics of output signals generated by non-linear devices. For instance, predictive correction techniques may be employed to ensure that signals comply with specified spectral limits (e.g., limits associated with a communications system or network).

Non-linearities may cause signals to exceed such spectral limits. For example, in TDMA systems (e.g., GSM/EDGE systems), amplifier non-linearities may cause an amplified ramp-up signal to rise too rapidly. As a result, this amplified signal may have spectral components that exceed specified spectral limits. Similarly, such non-linearities may cause a TDMA ramp-down signals to fall too rapidly and exceed specified spectral limits.

Predictive correction may prevent such occurrences by predicting non-linearities and correcting an input signal to cancel the predictive non-linearities. This may involve extrapolating response characteristics from previously determined response characteristics. For example, an amplifier gain curve may be determined during a ramp-up (or ramp-down) operation. During the operation, the input signal may be modified to accommodate for corresponding gain curve values that are predicted or extrapolated. As a result, spectral characteristics of the amplified output signal may be managed.

In embodiments, predictive correction techniques may be employed, as disclosed in U.S. patent application Ser. No. 11/639,999, filed on Dec. 15, 2006, and entitled "Method and Apparatus for a Nonlinear Feedback Control System". This application is incorporated herein by reference in its entirety.

Figure 2:
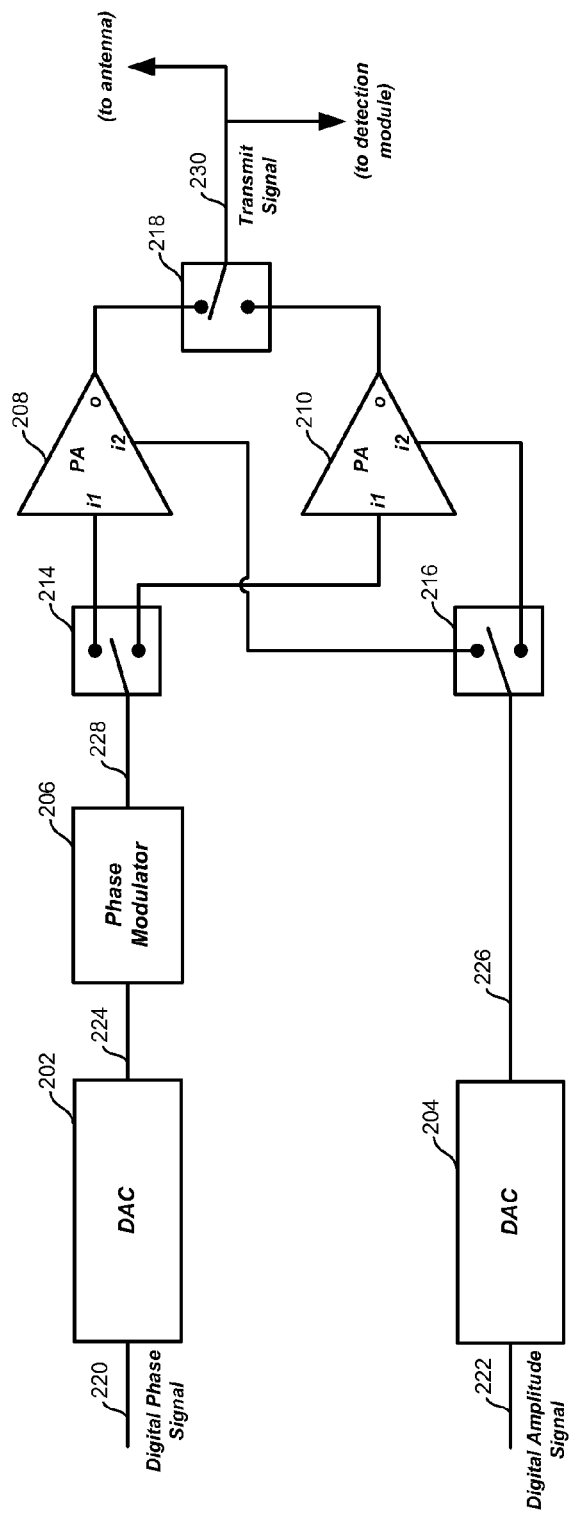
FIG. 2 is a diagram showing an exemplary implementation of a non-linear element.

FIG. 2 is a diagram illustrating an exemplary implementation 200 of non-linear module 102. As shown in FIG. 2, implementation 200 includes a first digital to analog converter (DAC) 202, a second DAC 204, a phase modulator 206, a power amplifier (PA) 208, and a second PA 210. Also, implementation includes switch modules 214, 216, and 218. These elements may be implemented in hardware, software, firmware, or any combination thereof.

DAC 202 receives a digital phase signal 220, and DAC 204 receives a digital amplitude signal 222. In embodiments, these digital signals may be received from calibration module 106 or pre-distortion module 108. In particular, these signals may be received from calibration Based on these received digital signals, DAC 202 produces a corresponding analog phase signal 224, and DAC 204 produces an analog amplitude signal 226. As shown in FIG. 2, analog phase signal 224 is sent to phase modulator 206, and analog amplitude signal 226 is sent to PA 208 or PA 210 (based on the setting of switch module 216). In embodiments, DACs 202 and/or 204 may be omitted. Thus, digital signals may be directly provided to PAs 208 and/or 210.

Phase modulator 206 performs phase modulation on analog phase signal 224. This involves generating an analog phase modulated signal 228. This generated signal is at a carrier frequency having a phase that varies in correspondence with digital phase signal. The phase modulated signal 228 is provided to PA 208 or PA 210 (based on the setting of switch modules 214).

As described above, signals are selectively routed to PA 208 and PA 210 based on the settings of switch modules 214 and 216. In embodiments, PA 208 is for low band operations and PA 210 is for high band operations. However, other power amplifier arrangements and/or band allocations may be employed. When PA 208 is selected (e.g., for low band operations), switch modules 214 and 216 are set so that PA 208 receives signals 226 and 228. However, when PA 210 is selected (e.g., for high band operations), switch modules 214 and 216 are set so that PA 210 receives signals 226 and 228.

FIG. 2 shows that each of PA 208 and PA 210 includes input terminals i1 and i2, and an output terminal o. When selected (through switch modules 214 and 216) input terminal i1 receives phase modulated signal 228, and input terminal i2 receives amplitude signal 226. Based on these inputs, an output signal is produced at output terminal o.

This output signal is sent (through switch module 218) to an antenna (not shown) for wireless transmission as signal 230. Accordingly, switch module 218 is set in correspondence with switch modules 214 and 216. In addition, transmit signal 230 may be sent to a detection module (e.g., detection module 104)

Figure 3:
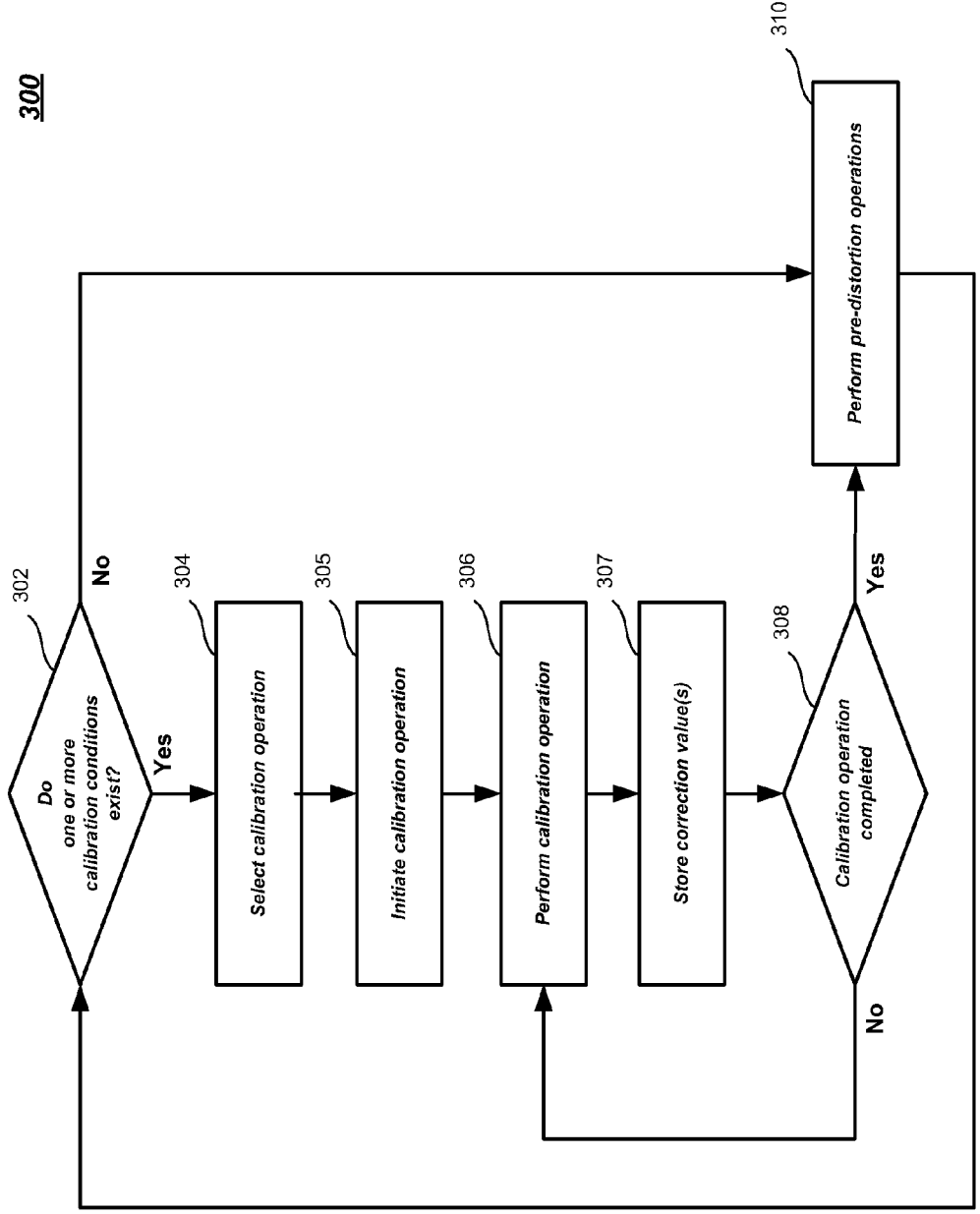
FIG. 3 is a flow diagram of an exemplary operation.

FIG. 3 is a diagram of a logic flow 300, which may be representative of operations performed by one or more embodiments. Although this diagram shows a particular sequence of acts, other sequences may be employed. Also, the depicted acts may be performed in various parallel and/or sequential combinations. The logic flow of FIG. 3 is described with reference to FIG. 1 for purposes of illustration, and not limitation. Therefore, such logic flows may be employed with other embodiments.

The flow of FIG. 3 includes a block 302. At this block, it is determined whether a calibration condition exists. If so, then operation proceeds to a block 304. Otherwise, operation proceeds to a block 310.

At block 304, a calibration operation corresponding to the calibration condition is selected. As described herein, the selected calibration operation may generate correction value(s) and generate an input signal from a pre-input signal.

Thus, block 304 may involve selecting an operation from multiple calibration operations. Such multiple calibration operations may include a first operation that produces the input signal from the pre-input signal according to a predictive technique, and a second operation that produces the input signal from the pre-input signal according to a non-predictive technique. However, embodiments are not limited to such calibration operations.

The selection of a calibration operation may be based on one or more factors. Such factors may include, for example, the format of the pre-input signal (e.g., intermittent or steady). Also, such factors may include whether calibration is to occur during data transmission. For example, a predictive calibration operation may be selected when an intermittent signal format is employed and no data transmission is to occur during the calibration operation. In contrast, a non-corrective calibration operation may be selected when a steady signal format is employed and data transmission is to occur during the calibration operation.

Table 1, below, provides exemplary calibration conditions and corresponding calibration operations. Embodiments are not limited to the examples of Table 1. Accordingly, embodiments may employ other calibration conditions and/or calibration operations, as well as networks other than TDMA, GSM/EDGE, and WCDMA networks.

TABLE 1

| Calibration Condition | Calibration Operation |
| --- | --- |
| Ramp-up procedure corresponding to TDMA burst | Calibration with predictive correction |
| Ramp-down procedure corresponding to TDMA burst | Calibration with predictive correction |
| Transmit power level change according WCDMA power level control protocol | Calibration without predictive correction |

In addition to the calibration conditions and operations provided in Table 1, further calibration conditions and/or calibration operations may be employed. Such calibration conditions may include one or more changes in operational parameters. Examples of such parameters include (but are not limited to) output power level, output signal frequency, and/or operating temperature. Thus, embodiments may include one or more temperature sensors (e.g., thermistor(s)).

Changes to one or more of such parameter(s) (such as change(s) exceeding a predetermined threshold) may trigger corresponding calibration operations. In embodiments, such corresponding operations may provide calibration without predictive correction. However, in embodiments, calibration with predictive correction may be employed for certain instances of such change(s).

The selected calibration operation is initiated at a block 305. With reference to FIG. 1, this may involve control module 112 sending calibration directive 132 to calibration module 106. This directive may specify the selected calibration operation, as well as provide other information. Also, block 305 may involve setting control signals 126 and 128 such that calibration module 108 receives pre-input signal 130 and generates input signal 120.

At a block 306, the selected calibration operation is performed. This calibration operation generates one or more correction values, which may be used for predistortion operations.

These correction value(s) are stored in a storage medium at a block 307. In the context of FIG. 1, these value(s) may be stored in correction data storage module 110.

At a block 308, it is determined whether the calibration operation is completed. Once the calibration operation is completed, then operations proceed to a block 310.

At block 310, pre-distortion operations are performed. With reference to FIG. 1, this may involve control module 112 setting control signals 126 and 128 such that pre-distortion module 108 receives pre-input signal 130 and generates input signal 120.

As shown in FIG. 3, operation may return to block 302. Therefore, multiple calibration operations may occur in accordance with various events, schedules, and so forth.

Figure 4:
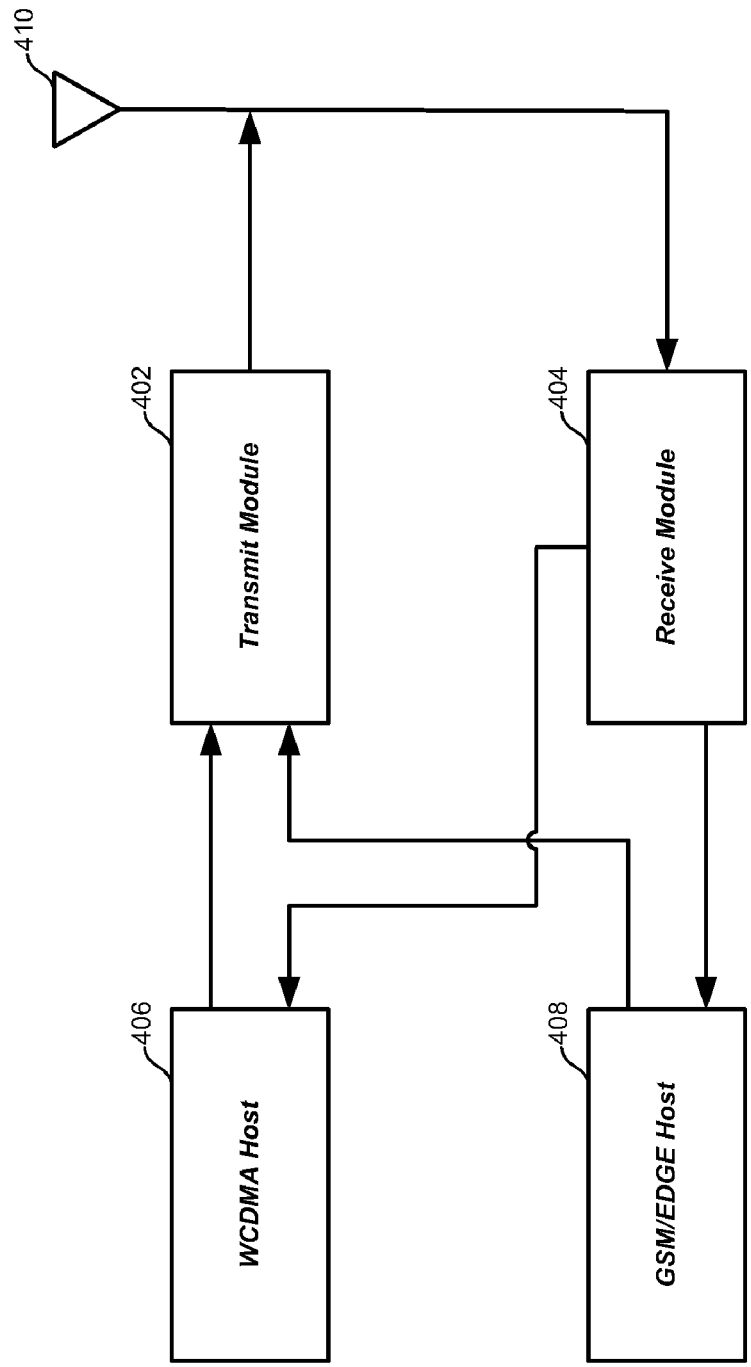
FIG. 4 a diagram of an exemplary device.

FIG. 4 is a diagram of a device 400. Device 400 may include various elements. For example, FIG. 4 shows device 400 including a transmit module 402, a receive module 404, a WCDMA host 406, a GSM/EDGE host 408, and an antenna 410. These elements may be implemented in hardware, software, firmware or any combination thereof.

WCDMA host 406 and GSM/EDGE host 408 may each send signals to transmit module 402, and receive signals from receive module 404. Such signals may be basedband signals that correspond to wireless signals transmitted and received by antenna 410. In particular, WCDMA host 406 may exchange WCDMA signals with transmit module 402 and receive module 404. Also, WCDMA host 406 may operate according to various WCDMA communications protocols.

Similarly, GSM/EDGE host 408 may exchange GSM/EDGE signals with transmit module 402 and receive module 404. Also, GSM/EDGE module 408 may operate according to various GMS/EDGE communications protocols.

Thus, apparatus 400 provides multi-mode (e.g., GSM/EDGE and WCDMA) operation. Accordingly, apparatus 400 may be included in devices such as mobile phones, wireless personal digital assistants (PDAs), smartphones, notebook computers and so forth.

As described above, transmit module 402 receives signals from WCDMA host 406 and GSM/EDGE host 408. In turn, transmit module 402 processes these signals and produces an output signal 420 for wireless transmission via antenna 410. In embodiments, transmit module 402 may include elements of apparatus 100. Accordingly, transmit module 402 may perform calibration and pre-distortion operations, as described herein. Further, transmit module 402 may perform polar modulation. Such polar modulation may employ the features described above with reference to FIG. 2.

Receive module 404 receives a signal 422 from antenna 410. From this signal, receive module 404 generates a baseband signal, which may be sent to WCDMA host 406 and/or GSM/EDGE host 408. As described above, receive module 404 may be implemented in hardware, software, firmware, or any combination thereof While various embodiments of the present invention have been described above, it should be understood that they have been presented by way of example only, and not in limitation. Thus, embodiments are not limited to contexts involving TDMA, GSM/EDGE, and/or WCDMA signals.

Accordingly, it will be apparent to persons skilled in the relevant arts that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

The invention claimed is:

1. An apparatus, comprising:
a non-linear module configured to produce an output signal from an input signal;
a control module configured to select, upon an occurrence of a calibration condition, a calibration operation from two or more calibration operations;
a calibration module configured to perform the selected calibration operation, said selected calibration operation comprising
  (a) predicting or extrapolating at least one non-linear characteristic of said non-linear module based on said output signal and a reference signal,
  (b) based on said predicting or extrapolating, generating one or more correction values for use during subsequent pre-distortion operations to compensate for said non-linear characteristic of the non-linear module,
  (c) performing said predicting or extrapolating using predicative correction operations to produce the input signal from a pre-input signal when said calibration condition comprises a power ramp-up or a power ramp-down of said pre-input signal, said predictive correction operations comprising changing values of said pre-input signal based on said predicted or extrapolated non-linear characteristic of said non-linear module, and
  (d) performing said predicting or extrapolating while by-passing said predictive correction operations when said calibration condition comprises a steady state of said pre-input signal during which changes to a parameter selected from the group consisting of a power level and a frequency are less than a predetermined threshold associated with said parameter.

2. The apparatus of claim 1, wherein the non-linear module includes a power amplifier.

3. The apparatus of claim 1, further comprising a storage medium to store the one or more correction values.

4. The apparatus of claim 1, further comprising a pre-distortion module to generate the input signal from the pre-input signal based on the one or more correction values.

5. The apparatus of claim 1, wherein the calibration condition is a power level change when the pre-input signal is conveying data.

6. The apparatus of claim 1, wherein the pre-input signal is a wideband code division multiple access (WCDMA) signal.

7. The apparatus of claim 1, wherein the pre-input signal is a time division multiple access (TDMA) signal.

8. A method, comprising:
selecting, upon an occurrence of a calibration condition, a calibration operation from two or more calibration operations; and
performing the selected calibration operation for a non-linear module that produces an output signal from an input signal, said selected calibration operation comprising:
  (a) predicting or extrapolating at least one non-linear characteristic of said non-linear module based on said output signal and a reference signal,
  (b) based on said predicting or extrapolating, generating one or more correction values for use during subsequent pre-distortion operation to compensate for said non-linear characteristic of the non-linear module,
  (c) performing said predicting or extrapolating using predicting correction operations to produce the input signal from a pre-input signal when said calibration condition comprises a power ramp-up or a power ramp-down of said pre-input signal, said predictive correction operations comprising changing values of said pre-input signal based on said predicted or extrapolated non-linear characteristic of said non-linear module, and
  (d) performing said predicting or extrapolating while by-passing said predictive correction operations when said calibration condition comprises a steady state of said pre-input signal during which changes to a parameter selected from the group consisting of a power level and a frequency are less than a predetermined threshold associated with said parameter.

9. The method of claim 8, wherein the selected calibration operation stores the one or more correction values in a storage medium.

10. The method of claim 8, further comprising bypassing said predictive correction operations when the calibration condition is a power level change when the pre-input signal conveys data.

11. The method of claim 10, wherein the power level change is in accordance with a power control protocol.

12. The method of claim 8, wherein the calibration condition comprises a change in operating temperature.

13. An apparatus, comprising:
a transmit module configured to generate an output signal; and
an antenna to wirelessly transmit the output signal;
wherein the transmit module includes:
  a non-linear module configured to produce an output signal from an input signal;
  a control module configured to select, upon an occurrence of a calibration condition, a calibration operation from two or more calibration operations;
  a calibration module configured to perform the selected calibration operation, said selected calibration operation comprising
    (a) predicting or extrapolating at least one non-linear characteristic of said non-linear module based on said output signal and a reference signal,
    (b) based on said predicting or extrapolating, generating one or more correction values for use during subsequent pre-distortion operations to compensate for said non-linear characteristic of the non-linear module,
    (c) performing said predicting or extrapolating using predictive correction operations to produce the input signal from a pre-input signal exclusively when said calibration condition comprises a power ramp-up or a power ramp-down of said pre-input signal, said predictive correction operations comprising changing values of said pre-input signal based on said predicted or extrapolated non-linear characteristic of said non-linear module, and (d) performing said predicting or extrapolating while by-passing said predictive correction operations when said calibration condition comprises a steady state of said pre-input signal during which changes to a parameter selected from the group consisting of a power level and a frequency are less than a predetermined threshold associated with said parameter.

14. The apparatus of claim 13, further comprising a storage medium to store the one or more correction values.

15. The apparatus of claim 13, further comprising a receive module to receive signals from the antenna.

* * * * *